US012787479B2

(12) United States Patent
Arbell

(10) Patent No.: US 12,787,479 B2
(45) **Date of Patent: *Nov. 3, 2026**

(54) SUPERLATTICE FILM

(71) Applicant: ARBELL ENERGY LTD, Ramat-HaSharon (IL)

(72) Inventor: Matan Arbell, Ramat-HaSharon (IL)

(73) Assignee: ARBELL ENERGY LTD, Ramat-HaSharon (IL)

( * ) Notice: Subject to any disclaimer, the term of this patent is extended or adjusted under 35 U.S.C. 154(b) by 0 days.

This patent is subject to a terminal disclaimer.

(21) Appl. No.: 18/992,851

(22) PCT Filed: Jul. 12, 2023

(86) PCT No.: PCT/IL2023/050727
§ 371 (c)(1),
(2) Date: Jan. 9, 2025

(87) PCT Pub. No.: WO2024/013746
PCT Pub. Date: Jan. 18, 2024

(65) Prior Publication Data

US 2026/0020370 A1 Jan. 15, 2026

Related U.S. Application Data

(60) Provisional application No. 63/388,401, filed on Jul. 12, 2022.

(51) Int. Cl.
*H10F 77/14* (2025.01)
*H10F 10/17* (2025.01)

(52) U.S. Cl.
CPC .......... *H10F 77/146* (2025.01); *H10F 10/17* (2025.01)

(58) Field of Classification Search
CPC ..... H10F 77/146-1468; H10F 77/1433; H10F 77/162; H10F 77/1625; H10F 10/19; H10F 10/142; H10F 10/161
See application file for complete search history.

(56) References Cited

U.S. PATENT DOCUMENTS

2009/0255580 A1* 10/2009 Dasgupta .............. H10F 77/146 977/774
2010/0240167 A1* 9/2010 Dasgupta .............. H10F 77/146 257/E31.032

(Continued)

FOREIGN PATENT DOCUMENTS

JP 6030971 B2 11/2016
WO 2021070169 A1 4/2021

OTHER PUBLICATIONS

JP-6030971-B2 English machine translation (Year: 2016).*

(Continued)

*Primary Examiner* — Andrew J Golden
(74) *Attorney, Agent, or Firm* — CANTOR COLBURN LLP

(57) ABSTRACT

A superlattice film includes a superlattice structure that is arranged between a first conductor and a second conductor and includes a plurality of superimposed layers of nanocrystals; wherein each of the layers has an array of nanocrystals which have a same energy gap, and wherein the layers are sorted by the energy gap of the nanocrystals in ascending order from the first conductor towards the second conductor, so that a maximum energy gap layer is adjacent to the first conductor and a minimum energy gap layer is adjacent to the second conductor.

The superlattice film further includes at least one among
an electron blocking layer interposed between the
maximum energy gap layer and the first conductor,
and (Continued)

an electron transport layer interposed between the minimum energy gap layer and the second conductor.

11 Claims, 5 Drawing Sheets

(56) References Cited

U.S. PATENT DOCUMENTS

| | | | | |
|---|---|---|---|---|
| 2011/0197956 | A1* | 8/2011 | Chang | H10F 77/1645 136/255 |
| 2012/0097225 | A1* | 4/2012 | Nomura | H10F 77/146 136/255 |
| 2012/0097228 | A1 | 4/2012 | Yoshikawa et al. | |
| 2014/0196778 | A1 | 7/2014 | Lee | |
| 2014/0326302 | A1* | 11/2014 | Arakawa | H10F 77/146 977/948 |
| 2015/0364628 | A1 | 12/2015 | Nozawa et al. | |

OTHER PUBLICATIONS

International Search Report for Application No. PCT/IL2023/050727, dated Sep. 27, 2023, 3 pages.
Written Opinion for Application No. PCT/IL2023/050727, dated Sep. 27, 2023, 5 pages.

* cited by examiner

SUPERLATTICE FILM

CROSS-REFERENCE TO RELATED APPLICATIONS

This application is a 35 U.S.C. § 371 National Stage patent application of PCT/IL2023/050727, filed on 12 Jul. 2023, which claims the benefit of U.S. patent application 63/388,401, filed on 12 Jul. 2022, the disclosures of which are incorporated herein by reference in their entirety.

TECHNICAL FIELD

The present disclosure relates to a superlattice film, in particular but not exclusively for photovoltaic devices such as thin film solar cells, and a modular device comprising a plurality of superlattice film.

BACKGROUND OF THE DISCLOSURE

As known, a solar cell, or photovoltaic cell, is a device that converts the energy of light directly into electricity by the photovoltaic effect.

The most relevant characteristic of a solar cell is its efficiency.

The solar cells of the first generation—also called conventional, traditional or wafer-based cells—are usually made of crystalline silicon and more precisely include materials such as polysilicon and monocrystalline silicon. Individual traditional solar cells are commonly combined to form modules, otherwise known as solar panels.

Over the course of time, a second generation of solar cells, commonly known as thin film solar cells, have been developed.

The known thin film solar cells are normally made by depositing one or more thin layers, or thin film (TF) of photovoltaic material on a substrate, such as glass, plastic or metal. The thin film usually comprises materials such as cadmium telluride (CdTe), copper indium gallium diselenide (CIGS), and amorphous thin-film silicon (a-Si, TF-Si).

The film thickness varies from a few nanometers (nm) to tens of micrometers (μm) and thus the thin film solar cells are much thinner than the conventional silicon-based solar cells. This allows the thin film solar cells to be more flexible, and lower in weight and therefore more versatile than the crystalline silicon solar cells. Furthermore, these known thin film solar cells are cheaper than conventional crystalline silicon solar cells.

For example, nowadays, thin film solar cells are commonly used in building integrated photovoltaics and as semi-transparent photovoltaic glazing material that can be laminated onto windows.

However, at the state of the art, thin film solar cells are less efficient than conventional crystalline silicon solar cells.

In fact, the known thin film solar cells have a maximum efficiency of circa 10%.

Recently, new materials which can be used as absorbing photovoltaic material in a thin film solar cells have been studied, among which there are superlattice structures.

As known, the superlattice to which reference is made is a periodic structure comprising an array of nanocrystals, also known as "quantum dots" or "quantum wires", which are semiconductor particles a few nanometers in size. More precisely, such nanocrystals have a size that is less than the Bohr radius of the substance they are made of, so that they have peculiar optical and electronic properties due to quantum effects.

Usually, photovoltaic superlattices are isotropic structures wherein the nanocrystals are, in practice, shuffled.

Although theoretically very promising, these photovoltaic superlattices developed so far have not reached a sufficient efficiency to be useful in the commercial applications.

In fact, the currently used thin film solar cells having superlattice as absorbing photovoltaic material have an efficiency of about 8%-12%.

WO 2021/070169 discloses an improved superlattice structure for thin film solar cells which comprises a plurality of superimposed layers of nanocrystals and is configured to generate a flow of electrons across said layers when it is irradiated by a radiation. Each of the layers comprises an array of nanocrystals which have substantially the same size and shape and the nanocrystals of each of said layers have different size and/or different shape with respect to the nanocrystals of the other layers. In practice, in WO 2021/070169,the layers are sorted in such an order that the superlattice structure is anisotropic along the cross direction along which the electrical conductivity is required. As an effect of this feature, in the superlattice structure of WO 2021/070169 there is a preferential direction (i.e. the cross direction) for the electrons e− to flow.

The superlattice structure disclosed by WO 2021/070169 substantially improves the efficiency of a thin film solar cell, however further improvements are still possible and desirable, especially in terms of efficiency and versatility.

SUMMARY OF THE DISCLOSURE

The aim of the present disclosure is to solve the technical problem described above, obviates the drawbacks and overcomes the limitations of the background art, providing a superlattice film that has improved efficiency with respect to the prior art.

Within the scope of this aim, the disclosure provides a superlattice film that is easy to manufacture and at competitive costs.

Moreover, the present disclosure provides a superlattice fil that is highly versatile.

The present disclosure also provides an alternative to known solutions.

This aim, as well as these and other advantages that will become better apparent hereinafter, are achieved by providing a superlattice film comprising a superlattice structure that is arranged between a first conductor and a second conductor and comprises a plurality of superimposed layers of nanocrystals; wherein each of said layers comprises an array of nanocrystals which have a same energy gap, and wherein said layers are sorted by the energy gap of the nanocrystals in ascending order from said first conductor towards said second conductor, so that a maximum energy gap layer is adjacent to said first conductor and a minimum energy gap layer is adjacent to said second conductor;

said superlattice film further comprising at least one among:
- an electron blocking layer interposed between the maximum energy gap layer and the first conductor, and
- an electron transport layer interposed between the minimum energy gap layer and the second conductor.

This aim and these advantages are also achieved by providing a modular device according to the claims.

BRIEF DESCRIPTION OF THE DRAWINGS

The foregoing, as well as further characteristics and advantages of the present disclosure, will become better apparent from the following description of a preferred, but not exclusive, embodiment of a superlattice film, according to the disclosure, and of a modular device comprising the superlattice film illustrated by way of nonlimiting example in the accompanying drawings, wherein.

Figure 1:
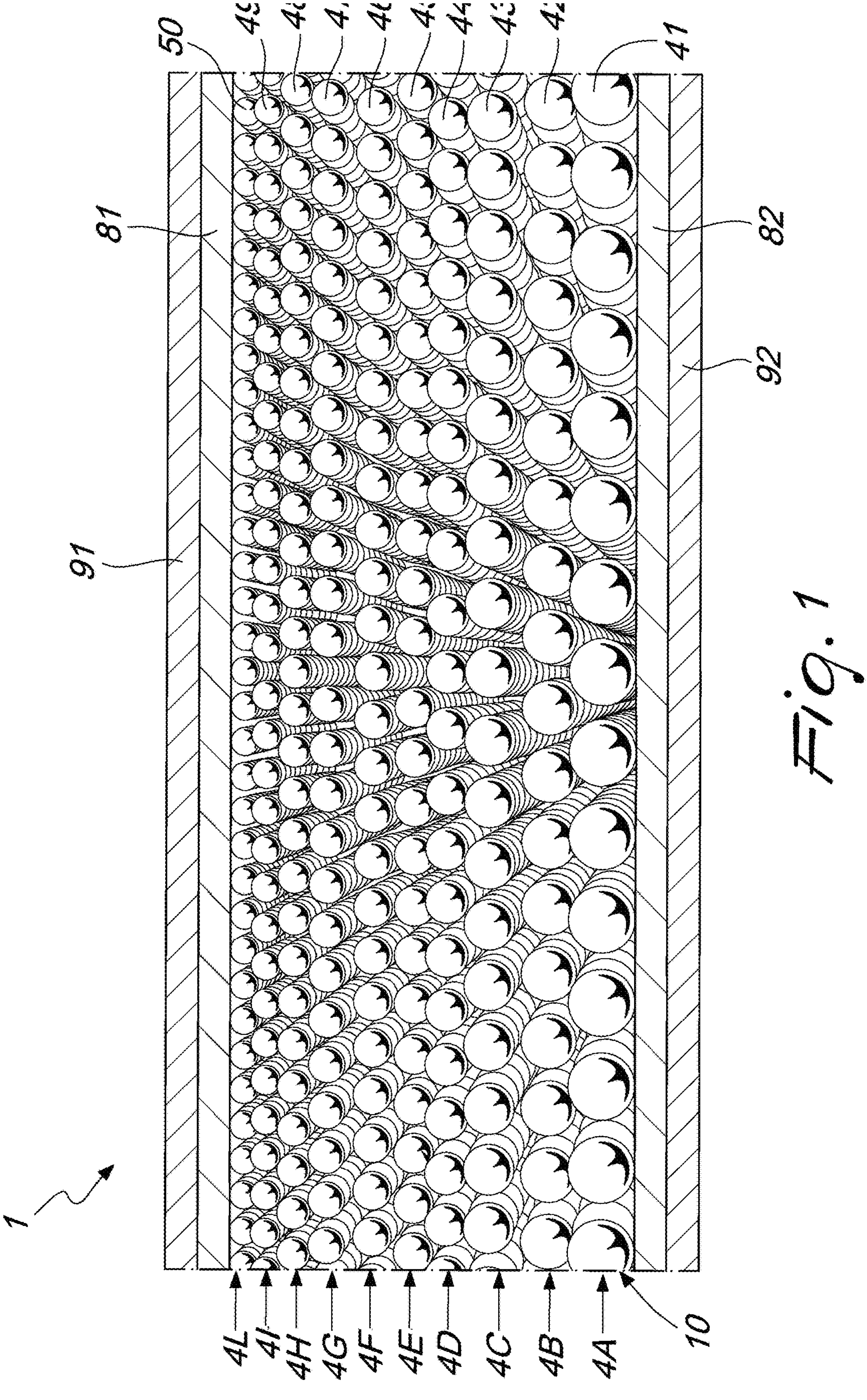
FIG. 1 is a schematic representation of a superlattice film, according to the disclosure.

It should be noted that the above-mentioned drawings must be intended as schematic, since they do not reflect the exact proportions, in order to better show the underlying structure of the disclosure.

DETAILED DESCRIPTION OF THE DRAWINGS

With reference to the cited figures, the superlattice film, generally designated by the reference numeral 1, comprises a superlattice structure 10 that is arranged between a first conductor 91 and a second conductor 92 (i.e. electrically conductive elements).

The conductors 91, 92 are preferably conductive layers.

Figure 3:
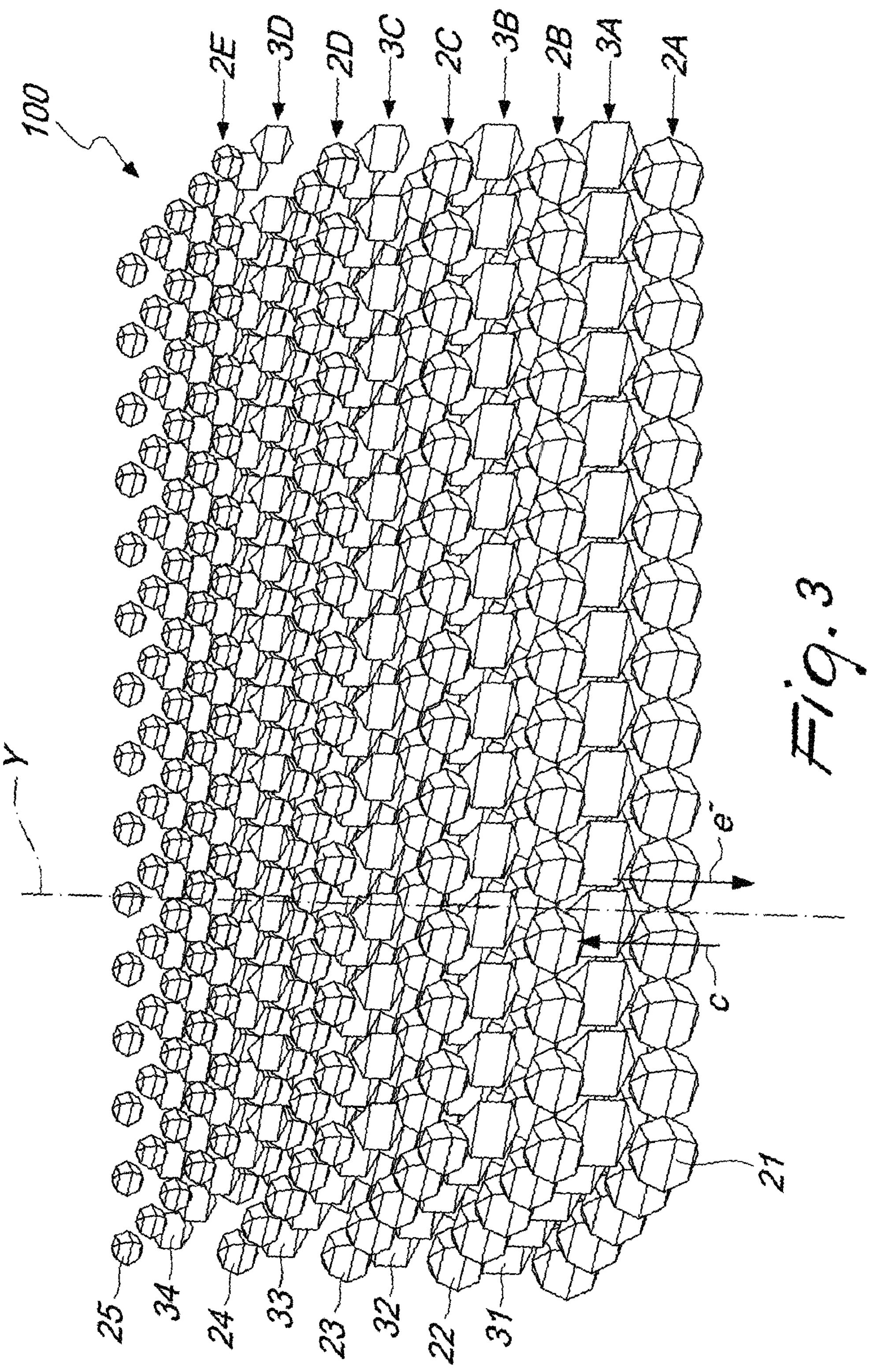
FIG. 3 is a schematic representation of an alternative superlattice structure.

The superlattice structure 10, 100 comprises a plurality of superimposed layers 4A-4L (or 2A-2E and 3A-3D in FIG. 3) of nanocrystals 41-50 (or 21-25 and 31-34 in FIG. 3).

Each of the layers 4A-4L; 2A-2E; 3A-3D comprises an array of nanocrystals 41-50, 21-25, 31-34 which have the same energy gap (as known, the energy gap in a nanocrystal is the difference of energy between the bottom of the conduction band and the top of the valence band of the electrons). In practice, to have the same energy gap, all the nanocrystals of a same layer 4A-4L; 2A-2E; 3A-3D have the same size and shape. It is useful to specify that the term "shape", in the present description and in the attached claims, is understood to reference the mere geometry (i.e the geometric structure) of a nanocrystal, regardless of its size.

In the superlattice structure 10, 100, the layers 2A-2L; 3A-3L; 4A-4L are sorted by the energy gap of the nanocrystals 41-50, 21-25, 31-34 in ascending order from the first conductor 91 towards the second conductor 92. In other words, the layers 2A-2L, 3A-3L, 4A-4L are sorted in such an order that the energy gap of the nanocrystals 41-50, 21-25, 31-34 decreases from the first conductor 91 to the second conductor 92.

In general, then, all the layers 4A-4L; 2A-2E, 3A-3E are sorted by the size of the nanocrystals 21-25, 31-34 in ascending order (along the cross direction Y along which the electrical conductivity is required) from the first conductor 91 to the second conductor 92.

In fact, the energy gap in a nanocrystal is inversely proportional to the size of the nanocrystal.

It follows that, as can been seen in FIG. 1, a maximum energy gap layer 4L, 2E (i.e. the layer that comprises the nanocrystals 50 having the maximum energy gap) is adjacent to the first conductor 91 and a minimum energy gap layer 4A; 2A (i.e. the layer that comprises the nanocrystal having the minimum energy gap) is adjacent to the second conductor 92.

Figure 2:
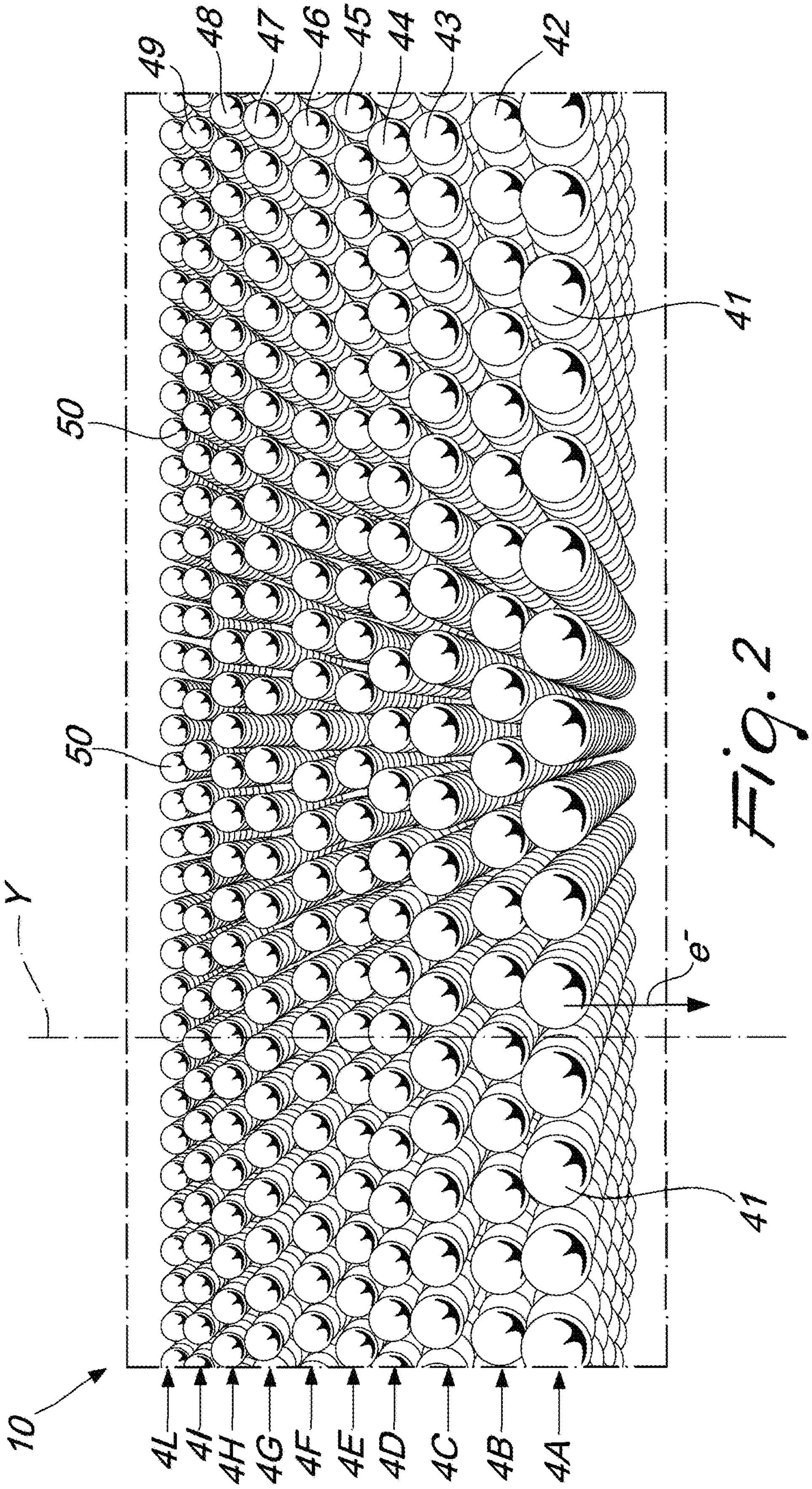
FIG. 2 is a schematic representation of a superlattice structure included in the superlattice film, according to the disclosure.

In this manner, in the superlattice structure 10, 100, the electrons e− are induced to flow along the cross-direction Y, from the maximum energy gap layer 4L towards the minimum energy gap layer 4L, and not vice versa In FIGS. 1, and 2 the nanocrystals are depicted as spherical only for simplicity, to indicate any possible shape: the nanocrystals 41-50 can have any suitable shape, such as hexadecahedronal, pentahedronal, octahedral, cuboctahedral, hexagonal, etc.

In the preferred embodiments, all the nanocrystals 41-50 of the same layer 4A-4L have the same size, and thus each layer 4A-4L differs from the others only for the size of the nanocrystals 41-50.

However, in some alternative embodiments, as the one depicted in FIG. 3, the superlattice structure 100 comprises layers of a first type 2A-2E which comprise nanocrystals having a first shape, and layers of a second type 3A-3D which comprise nanocrystals having a second shape that is different from said first shape; in this case the layers of the first 2A-2E type are alternated with the layers of the second type 3A-3D.

As to the composition of the nanocrystals 21-25, 31-34, they are made of semiconductor materials such as: CdS, CdSe, CdTe, InP, InAs, ZnS, ZnSe, HgTe, GaN, GaP, GaAs, GaSb, InSb, Si, Ge, AlAs, AlSb, PbSe, PbS, PbTe, InGaAs, InGaN, AlInGaP.

In the preferred embodiments, the nanocrystals 21-25, 31-34 are made of one or more of the following materials: PbSe, PbS, PbTe, CdS, CdSe, CdTe.

Preferably, all the nanocrystals 21-25, 31-34 are made of the same material.

In practice, the superlattice structure 10, 100 can be any superlattice structure described in WO 2021/070169.

Advantageously, the nanocrystals 41-50 are fixed in predetermined positions within the layers 4A-4L in such a way that they have both an energetic and a mechanical alignment.

In particular, it should be noted that within the superlattice structure 10, 100 the nanocrystals are fixed in predetermined positions in such a way that they have energetic alignment. In practice, the energy gaps of the nanocrystals are aligned so as to allow the electrons $e^-$ (excited by radiation S absorption) to transverse the whole superlattice structure 10, 100.

It also should be noted then that, within the superlattice structure 10, 100 the nanocrystals 41-50 21-25, 31-34 are fixed in predetermined positions in such a way that they have a shape directional alignment.

In greater detail, the shapes and the orientations of the nanocrystals 41-50 21-25, 31-34 are provided so that the nanocrystals have not only an energetic alignment, but also a mechanical alignment.

Ultimately, in the preferred embodiments, the nanocrystals 41-50, 21-25, 31-34 are fixed in predetermined positions, within said layers 4A-4L, 2A-2E, 3A-3E, in such a way that they have both an energetic and a mechanical alignment.

Advantageously, the gaps and connections between the nanocrystals 21-25, 31-34 is controlled by the Ligand molecules that are connected to the nanocrystals 21-25, 31-34.

As a result of the synergistic combination of such energetic and mechanical alignment, within the superlattice structure 10, 100 there is a very high probability that an electron e− excited in a nanocrystals 41-50 21-25, 31-34 as a result of the absorption of a photon "jumps" (moves) to the nanocrystal 41-50 21-25, 31-34 that is adjacent in the cross direction Y towards the second conductor contact 92 and there is a very low probability that such electron e− "jumps"

(moves) to the other nanocrystals 41-50, 21-25, 31-34 which are adjacent in the other directions.

According to the disclosure, the superlattice film 1 further comprises at least one among:

- an electron blocking layer (EBL) 81 (also called hole transport layer (HTL)) that is interposed between the maximum energy gap layer 4L and the first conductor 91, and
- an electron transport layer (ETL) 82 (also called hole blocking layer (HBL)) that is interposed between the minimum energy gap layer 4A and the second conductor 92.

Preferably, as in the illustrated embodiment, the superlattice film 1 comprises both said electron transport layer 82 and said electron blocking layer 81.

As known, an electron transport layer 82 is layer that has physical properties (such as charge mobility, energy level alignment, defect states, morphology, and related interfacial properties) which make it useful in extracting and transporting excited electron carriers and serves as a hole-blocking layer by suppressing charge recombination.

For example, the electron transport layer 82 can be made of one of the following materials: $SnO_2$, CdSe, $WO_3$, $ZnSnO_4$, ZnO, $PbI_2$, $TiO_2$, $SrTiO_3$, $CH_3NH_3BbI_3$, $ZnO_2$, Sno.

As known, an electron blocking layer 81 has substantially the opposite effect of the electron transport layer and it reduces the leakage of electrons toward the first conductor 91.

For example, the electron blocking layer 81 can be made of one of the following materials: Spiro-OMeTAD, PEDOT: PSS, PTAA (poly[bis(4-phenyl) (2, 4, 6-trimethylphenyl) amine]), P3HT, DM, TAT-tBuSty, X26, X36, FDT, SCZF-5, TTE, PTEG, Cuprous oxide ($Cu_2O$), cupric oxide (CuO), Copper(I) thiocyanate (CuSCN), Copper(I) iodide (CuI), Nickel oxide ($NiO_x$), $MOS_2$, $WS_2$, SANS, Cu(Tu)I, MnS, CuS, copper indium gallium disulfide (CIGS) nanocrystals such as $Cu(In_{0.75}Ga_{0.25})S_2$ and $Cu(In_{0.5}Ga_{0.5})S_2$.

The presence of the electron transport layer 82 and/or electron blocking layer 81 extends the work function between the conductor 91, 92 and the nanocrystals and thus increases the efficiency of the superlattice film 1, in particular when used as a photovoltaic device.

In order to allow the absorption by the superlattice structure 10, at least one conductor (namely the first conductor 91) is at least partially transparent to the light, preferably transparent to the visible light, even more preferably completely transparent to the light.

Figure 4:
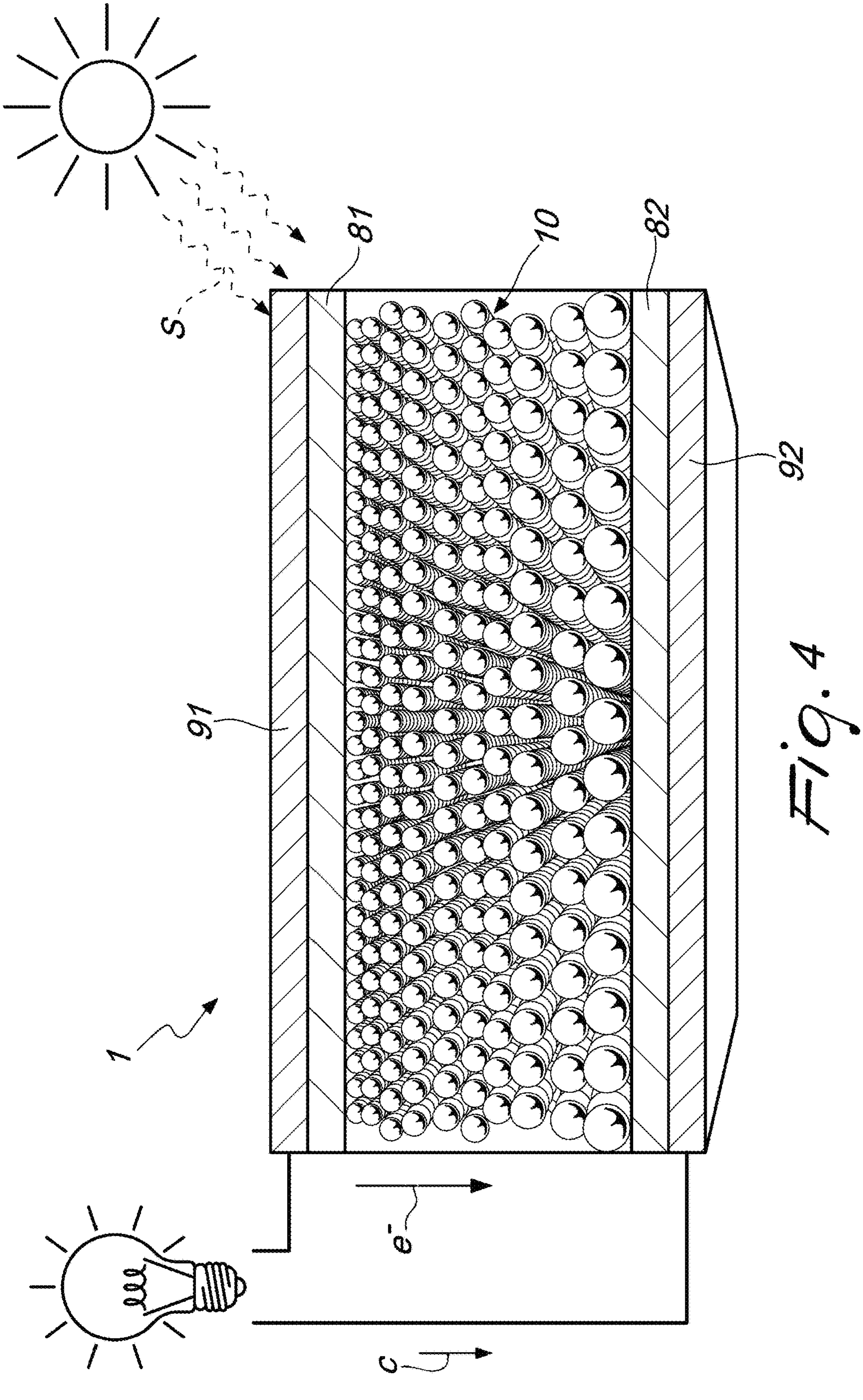
FIG. 4 is a schematic representation of a superlattice film, according to the disclosure, in use in a photovoltaic device.

FIG. 4 shows the superlattice film 1 in use as photovoltaic device (as a solar cell): the first conductor 91 and the second 9 conductor 92 are connected via an electric circuit so that, in consequence of the solar radiation S, the electrons e-flow along the cross direction Y from the first conductor 91 to the second conductor 92 (and consequently a current c flows in the circuit in the opposite direction).

Figure 5:
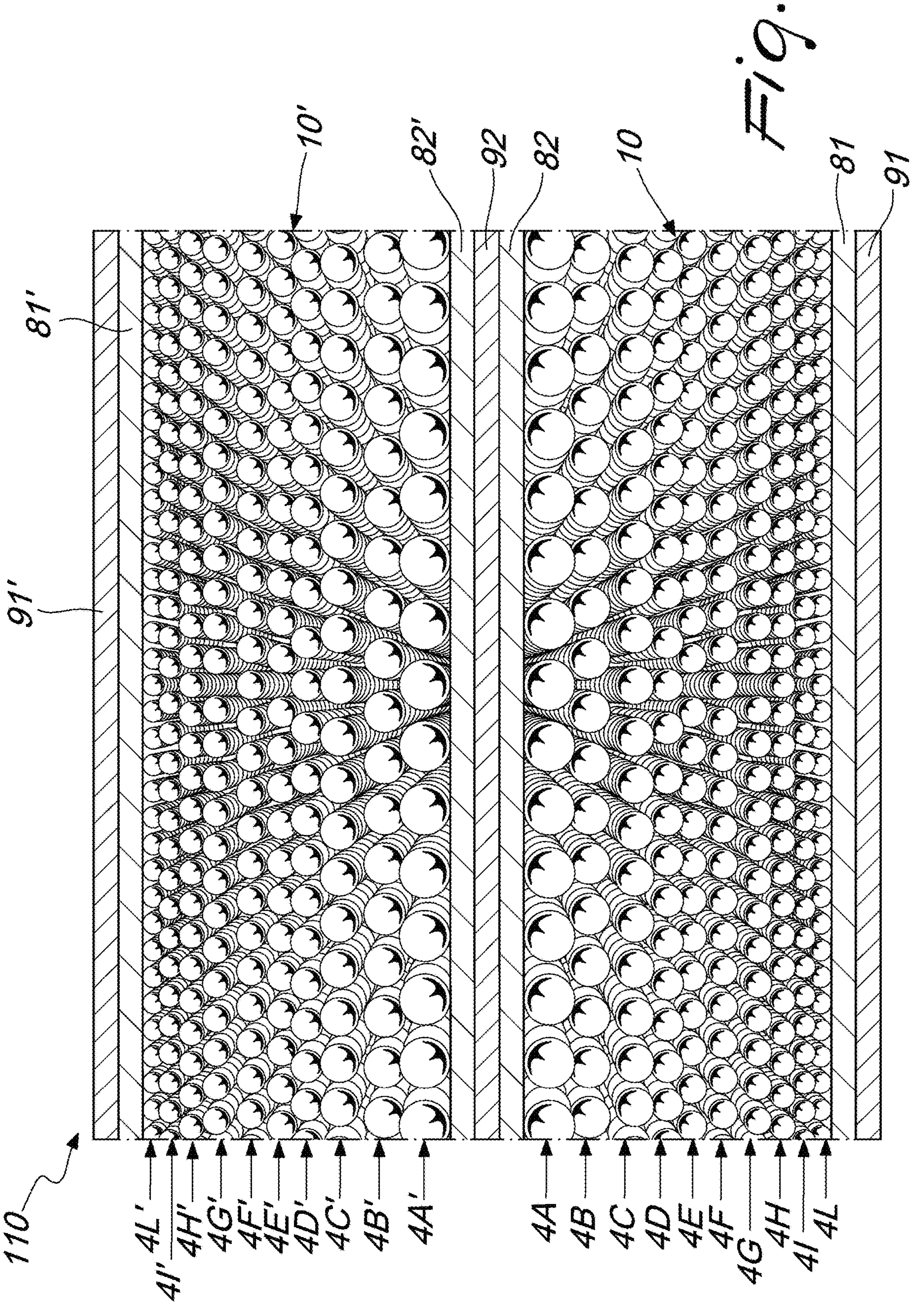
FIG. 5 is a schematic representation of a modular device comprising two superlattice films, according to the disclosure.

Two or more superlattice films 10, as described above, can be combined to form a modular device 110, such as the one depicted in FIG. 5.

In greater details, the modular device 110 comprises at least two superlattice films 1, 1', a first superlattice film 1 and a second superlattice film 1', which are stacked on top of each other, along the cross direction Y, so that the minimum energy gap layer 4A of the first superlattice film 1 faces the minimum energy gap layer 4A' of the second superlattice film 1'.

As shown in FIG. 5, the second superlattice film 1' comprises respective layers of nanocrystals 4A'-4L', including 4A', 4B', 4C', 4D', 4E', 4F', 4G', 4H', 4I', and 4L', a respective electron blocking layer (EBL) 81' and a respective electron transport layer ETL) 82'.

A conductive layer 92 is interposed between the minimum energy gap layer 4A of the first superlattice film 1 and the minimum energy gap layer 4A' of the second superlattice film 1', so that this single conductive layer 92 constitutes the second conductor 92 of both said first 1 and second 1' superlattice film 1.

In addition to the first 1 and the second 1' superlattice film the modular device 110 can comprise further superlattice films stacked in the same manner: for example at least a third superlattice film (not illustrated) that is stacked on the second superlattice film 1' so that the maximum energy gap layer of the third superlattice film faces the maximum energy gap layer 4L' of the second superlattice film 1'; in this case, a single conductive layer constitutes the first conductor 91' of both said second 1' and third superlattice films.

A fourth superlattice film can be stacked on the third superlattice film so that the minimum energy gap layer of the fourth superlattice film faces the minimum energy gap layer of the third superlattice film 1', and so on.

In other words, the modular device 110 comprises a series of superlattice structures 10, 100 alternated with conductive layers 91, 92.

In an operative configuration of the modular device 110 the conductors 91, 92, 91' are electrically connected to generate a current in a circuit when the modular device 110 is irradiated by the light.

It should be noted that inside the superlattice structure 10 it is provided a gradient that produces a "super conductor" in the electrical conductivity direction (the cross direction Y) and thus the superlattice film 1 (as well as the modular device 110) is usable for any application that requires such a behavior (e.g. for making supercapacitors).

According to an alternative and simpler solution, the sole superlattice structure 10 can be used for applications which require a "super conductor" behavior, such as supercapacitors.

The operation of the superlattice film is clear and evident from what has been described above.

In practice it has been found that the superlattice film according to the present disclosure achieves the intended aim and advantages, since it allows to improve the efficiency with respect to prior art.

Another advantage of the superlattice film, according to the disclosure, resides in that it allows to provide a thin film solar cell that is highly versatile.

A further advantage of the superlattice film, according to the disclosure, resides in that it is highly reliable, relatively easy to manufacture and at competitive costs.

Furthermore, the superlattice film, according to the disclosure, provides an alternative to known solutions.

The disclosure thus devised is susceptible of numerous modifications and variations, all of which are within the scope of the inventive concept; all the details may furthermore be replaced with other technically equivalent elements.

In practice, the materials used, as well as the dimensions, may be any according to the requirements and the state of the art.

Scope of the disclosure is thus indicated by the appended claims, rather than the foregoing description, and all changes that come within the meaning and range of equivalence of the claims are therefore intended to be embraced therein.

The invention claimed is:

1. A superlattice film comprising a superlattice structure that is arranged between a first conductor and a second conductor and comprises a plurality of superimposed layers of nanocrystals;

wherein each of said layers comprises an array of nanocrystals which have a same energy gap, and wherein said layers are sorted by the energy gap of the nanocrystals in ascending order from said first conductor towards said second conductor, so that a maximum energy gap layer is adjacent to said first conductor and a minimum energy gap layer is adjacent to said second conductor;

said nanocrystals having a size that is less than the Bohr radius of the substance they are made of;

wherein said layers comprise:

layers of a first type which comprise nanocrystals having a first shape, and layers of a second type which comprise nanocrystals having a second shape that is different from said first shape;

said layers of the first type being alternated with said layers of the second type;

wherein said layers of the first type and said layers of the second type are sorted by the size of the nanocrystals in ascending or descending order along a cross direction along which electrical conductivity is required;

said superlattice film further comprising at least one among:

an electron blocking layer interposed between the maximum energy gap layer and the first conductor, and an electron transport layer interposed between the minimum energy gap layer and the second conductor.

2. The superlattice film according to claim 1, which comprises both said electron transport layer and said electron blocking layer.

3. The superlattice film according to claim 1, wherein the electron transport layer is made of one of the following materials:

SnO, $SnO_2$, CdSe, $WO_3$, $ZnSnO_4$, ZnO, ZnO2 $PbI_2$, $TiO_2$, $SrTiO_3$.

4. The superlattice film according to claim 1, wherein said electron blocking layer is made of one of the following materials: Spiro-OMeTAD, PEDOT: PSS, PTAA, P3HT, DM, TAT-tBuSty, FDT, SCZF-5, TTE, PTEG, $Cu_2O$, CuO, CuSCN, CuI, $NiO_x$, $MoS_2$, $WS_2$, SANS, Cu(Tu)I, MnS, CuS, and CIGS nanocrystals.

5. The superlattice film according to claim 1, where said first conductor is at least partially transparent to the light.

6. The superlattice film according to claim 1, wherein said layers are sorted by size of the nanocrystals in ascending order from said first conductor to said second conductor.

7. The superlattice film according to claim 1, wherein said nanocrystals are fixed in predetermined positions within said layers such that they have both an energetic and a mechanical alignment.

8. The superlattice film according to claim 1, wherein said nanocrystal are made of one or more of the following materials:

CdS, CdSe, CdTe, InP, InAs, ZnS, ZnSe, HgTe, GaN, GaP, GaAs, GaSb, InSb, Si, Ge, AlAs, AlSb, PbSe, PbS, PbTe, InGaAs, InGaN, and AlInGaP.

9. The superlattice film according to claim 1, wherein said nanocrystal are made of one or more of the following materials: PbSe, PbS, PbTe, CdS, CdSe, and CdTe.

10. A modular device comprising at least two superlattice films according to claim 1, a first superlattice film and a second superlattice film, which are stacked so that the minimum energy gap layer of the first superlattice film faces the minimum energy gap layer of the second superlattice film;

wherein a single conductor layer constitutes the second conductor of both said first and second superlattice film.

11. The modular device according to claim 10, further comprising at least a third superlattice film that is stacked on said second superlattice film so that the maximum energy gap layer of the third superlattice film faces the maximum energy gap layer of the second superlattice film; wherein a single conductive layer constitutes the first conductor of both said second and third superlattice films.

* * * * *